United States Patent [19]

Loedel

[11] Patent Number: 5,669,524
[45] Date of Patent: Sep. 23, 1997

[54] ENCLOSURES

[75] Inventor: Chris W. Loedel, San Diego, Calif.

[73] Assignee: Chem-Tronics, Inc., Cajon, Calif.

[21] Appl. No.: 273,355

[22] Filed: Jul. 11, 1994

[51] Int. Cl.$^6$ ................................................ B65D 25/14
[52] U.S. Cl. .......................... 220/9.1; 220/669; 220/401
[58] Field of Search .......................... 220/9.1–9.3, 669, 220/414, 401, 493

[56] References Cited

U.S. PATENT DOCUMENTS

| | | | |
|---|---|---|---|
| 2,755,838 | 7/1956 | Kennedy, Jr. | 220/9.1 |
| 2,941,710 | 6/1960 | Smith et al. | 220/9.1 |
| 3,026,539 | 3/1962 | Lewis | 220/9.1 |
| 3,358,725 | 12/1967 | Bussard et al. | 220/9.1 |
| 4,373,643 | 2/1983 | Przytarski | 220/450 |
| 5,058,747 | 10/1991 | DeCroix et al. | 220/9.1 |

*Primary Examiner*—Joseph M. Moy
*Attorney, Agent, or Firm*—Hughes, Multer & Schacht, P.S.

[57] ABSTRACT

Lightweight, structurally integral enclosures with walls stiffened and strengthened by integral and joined reinforcing ribs which may also serve as heat sinks. These ribs, which may be capped or uncapped and located on the inner or outer sides of the enclosure walls, are formed by chemical milling. Wall components are preferably joined by electron beam welding. Seals may be used between the walls and a closure to isolate the interior of the enclosure. In electronic applications, conductive seals and sealants are employed to provide uniform and continuous shielding from electromagnetic interference and radio frequency interference.

10 Claims, 6 Drawing Sheets

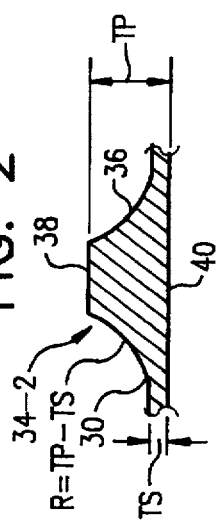
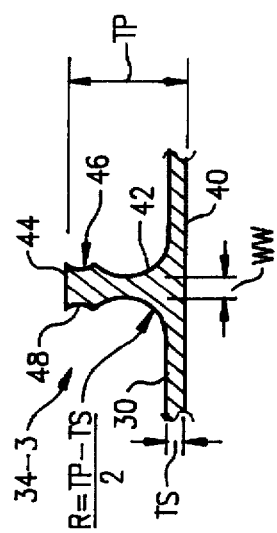
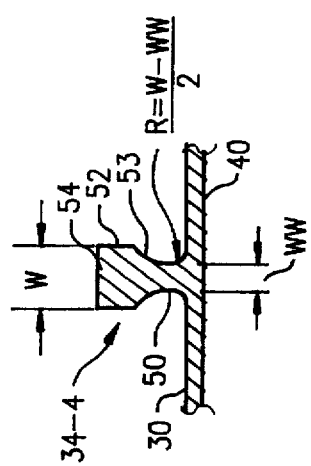
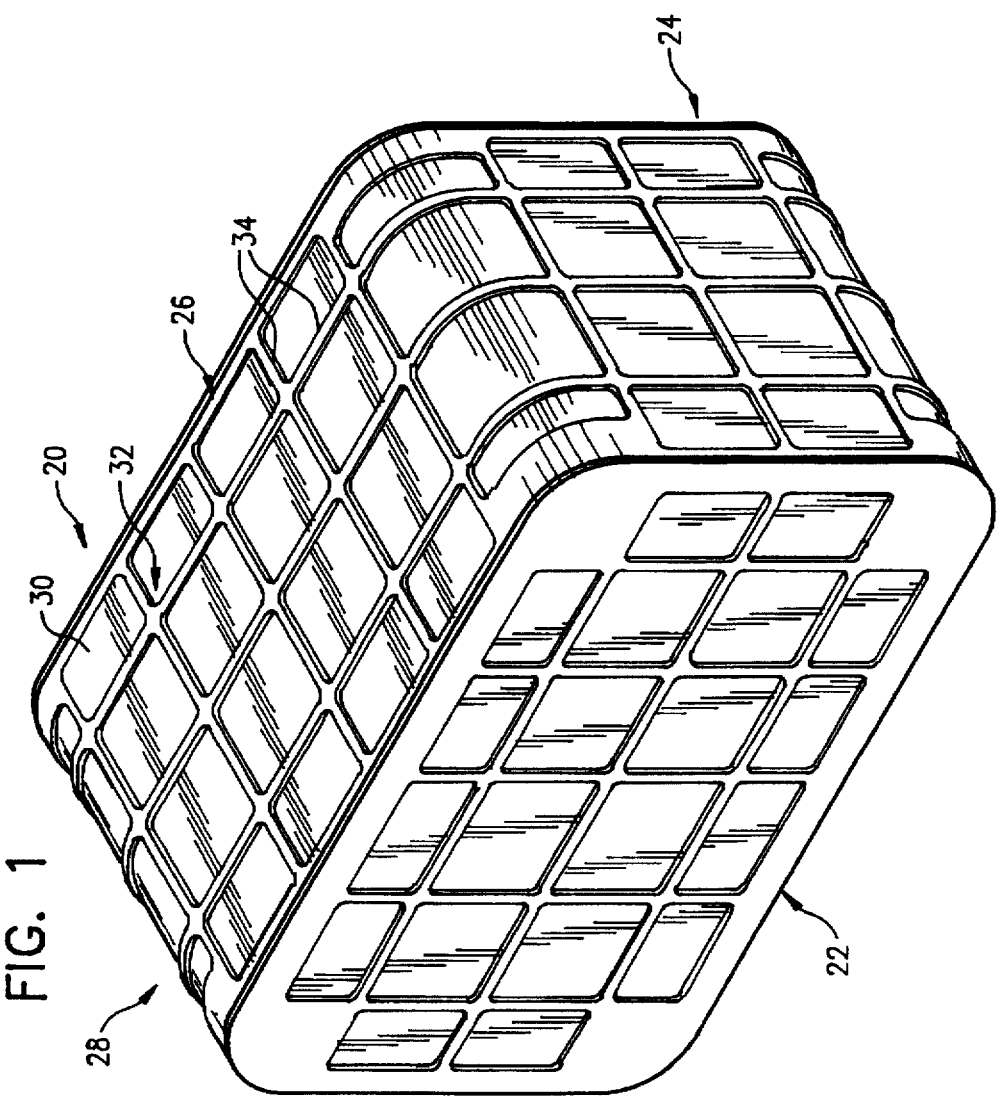

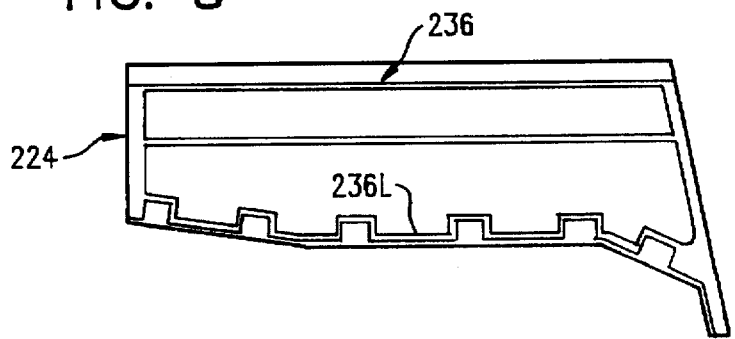
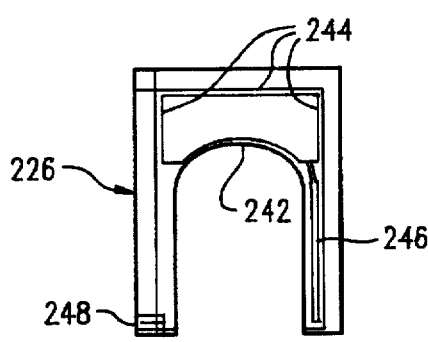
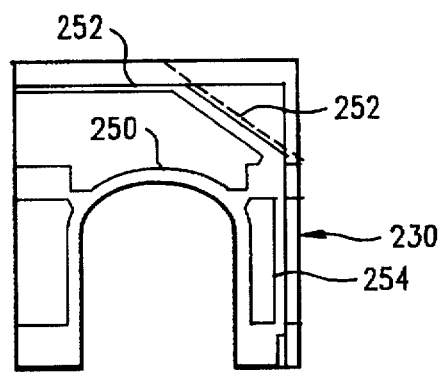
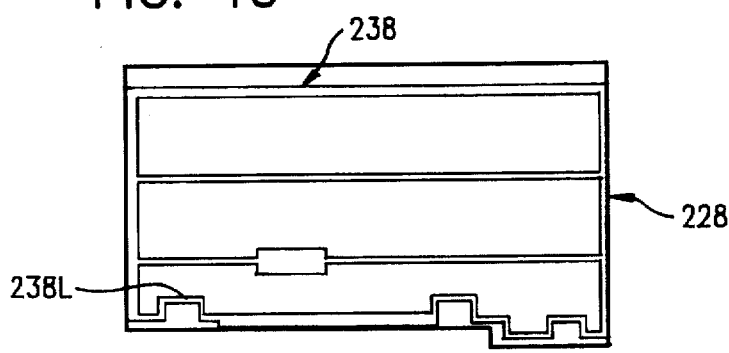
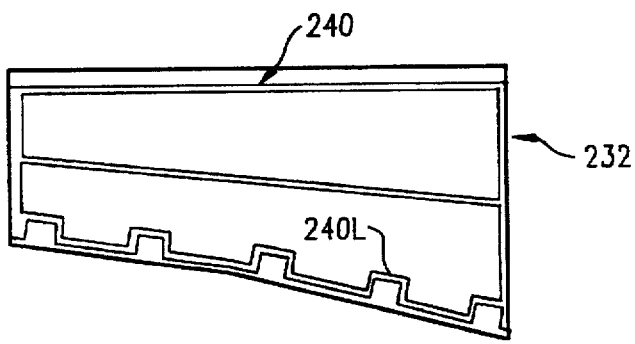

ENCLOSURES

TECHNICAL FIELD OF THE INVENTION

The present invention relates to enclosures (or containers) and, more particularly, to novel, improved, strong and lightweight containers which are particularly suited for demanding applications; e.g., to shield electronic components from EMI (electromagnetic interference) and RFI (radio frequency interference) and in marine and other environments in which pressure and corrosion resistance are required.

BACKGROUND OF THE INVENTION

The transportation of electronics equipment on air, land, and sea requires safe containment or packaging. Particularly for avionic applications, the cabinet housing the electronics needs to be tough and vibration resistant, yet lightweight because, increasingly, electronics have become significant negative weight contributors to the flying platform. Similarly, ground transported electronic and hand-held test equipment need to be lightweight to lessen fuel consumption and ease manual carry. There is also a requirement that any reduction in weight be so done that the enclosure still meet the rigorous vibration, shock, thermal dissipation, and environmental condition requirements (EMI, RFI, moisture, salt) established by the military and by commercial transport agencies.

Current efforts to reduce enclosure weight have concentrated on the use of lightweight composites or plastics although enclosures with machined metallic wall components have also been proposed. While enclosures made from those materials may weigh less than conventional enclosures, they have several major drawbacks; the first is price. In a program conducted by the Navy, a composite ¾ A.T.R. (air transport rack) enclosure was costed at $1,000 to $1,800 per manufactured pound. For a composite box weighing 6.7 pounds, this equates to a price of $6,700.

A second drawback of non-metallic enclosures designed for the demanding applications under discussion is that they are natural insulators. Epoxy metal particulates or wire mesh integration is required to dissipate heat and/or to shield packaged components from EMI and RFI These requirements add to the complexity of design, unit weight, and manufacturing complexity and thus cost. Another drawback is that non-metallic or plastic enclosures can degrade in ultraviolet and visible light.

SUMMARY OF THE INVENTION

There have now been invented, and disclosed herein, certain new and novel enclosures which are designed for the demanding applications discussed above and others of that character but are free of the drawbacks of the enclosures heretofore available or proposed for such applications.

The walls of these novel enclosures are fabricated from metallic materials chemically milled to a configuration which yields significant structural weight savings and, at the same time, vibration, shock, and corrosion resistance. This configuration consists of a thin skin with an array of integral stiffening and reinforcing ribs. The ribs may be on either the outside or the inside of the enclosure walls, and they may be arranged in a triangular or rectangular pattern. The ribs may be capped (i.e., have a "T" or "hourglass" section) or uncapped. Complementary arrays of capped and uncapped ribs may also be employed. In addition to their stiffening and reinforcing properties the integral ribs have the advantage that they are effective heat sinks and thus capable of dissipating significant amounts of thermal energy, a particularly important advantage in applications in which electronic or other heat sensitive components are packaged in the enclosure.

Other advantages of the resulting structures are superiority in their ability to dissipate thermal energy and to provide EMI and RFI shielding.

Other benefits of the novel enclosures disclosed herein include the following:

1. Easily integrated through holes, attachment points for handles, latches, door hinges, and internal mountings.
2. A low cost/weight ratio of fabrication, yielding enclosures typically costing 25 percent less than enclosures of the same weight manufactured from the advanced composites investigated by the Navy.
3. Versatility in that they can be produced from various metallic materials including titanium aluminide; titanium alloys; and aluminum, nickel, niobium, beryllium, and copper and their alloys.

Still other advantages of the present invention, attributable to the use of chemical milling as the manufacturing process of choice include:

1. Weight reduction to minimum allowable design thicknesses without the inducing of manufacturing stresses or alteration of the enclosure configuration.
2. The ability to impart structure after enclosure assembly in circumstances where conventional machining would be costly and often impossible since many of the enclosure features would be inaccessible to cutting tools.
3. All required metal removal for an entire enclosure assembly is accomplished in one time period.

The important advantages, features, and objects of the present invention will be apparent to the reader from the foregoing and the appended claims and as the ensuing detailed description and discussion proceeds in conjunction with the accompanying drawings.

BRIEF DESCRIPTION OF THE DRAWINGS

FIG. 1 is a perspective view of one representative enclosure constructed in accord with and embodying the principles of the present invention and having walls chemically milled into a lightweight configuration consisting of a thin skin with an array of integral and joined, stiffening, reinforcing, and heat dissipating ribs;

FIGS. 2, 3, and 4 depict three of the cross-sections which the ribs of the FIG. 1 enclosure may have;

FIGS. 7–12 are views looking from the inside of the shell at the wall components of the FIG. 6 shell;

3

Figure 13:
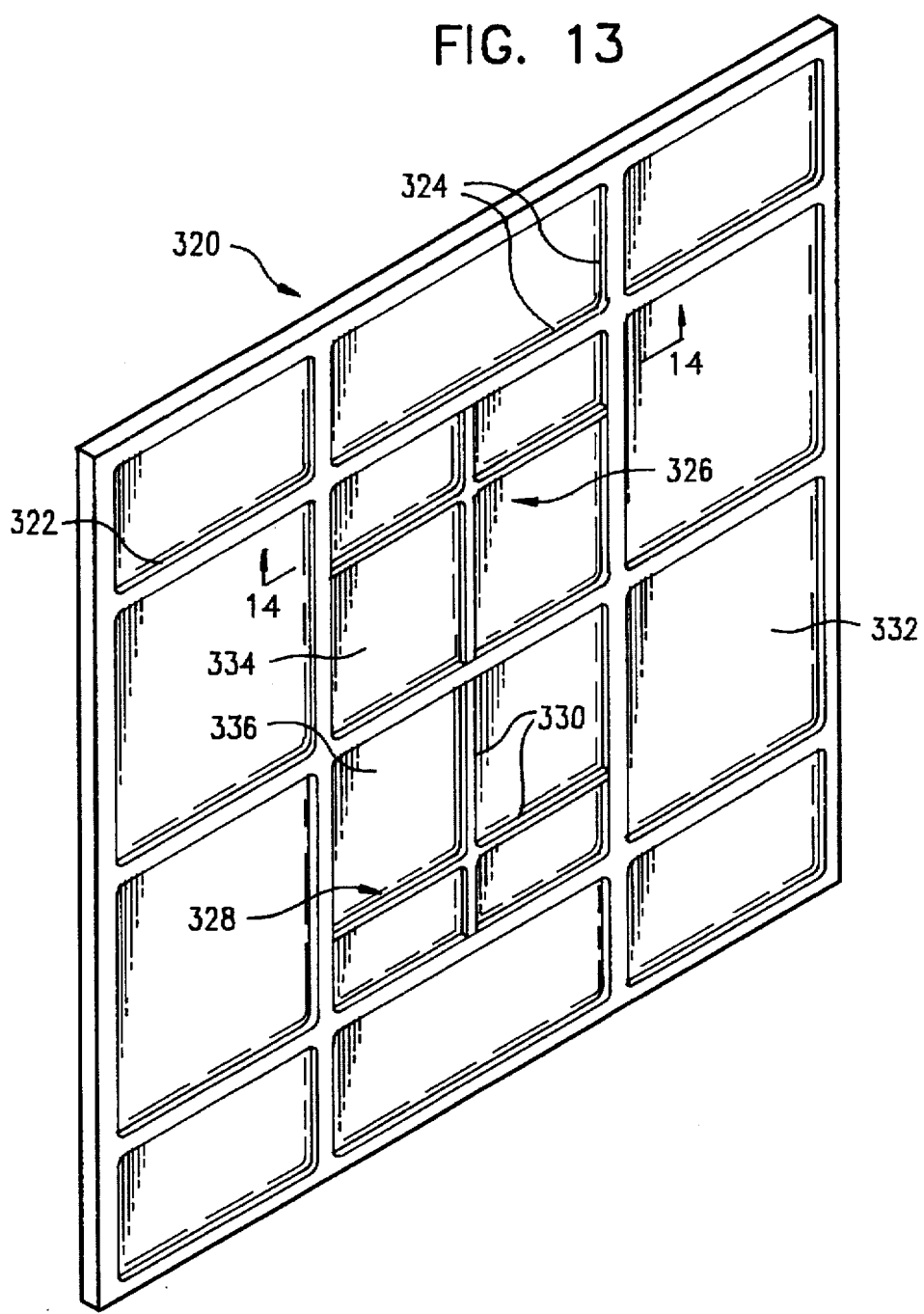
Figure 14:
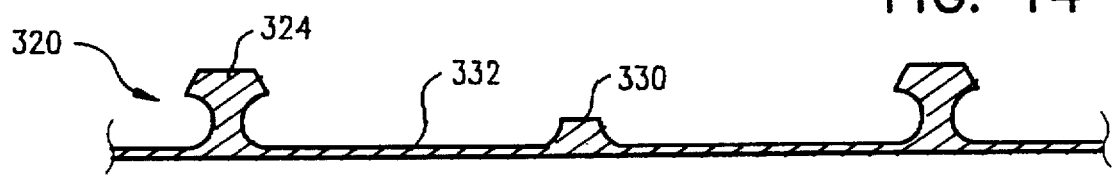
Figure 15:
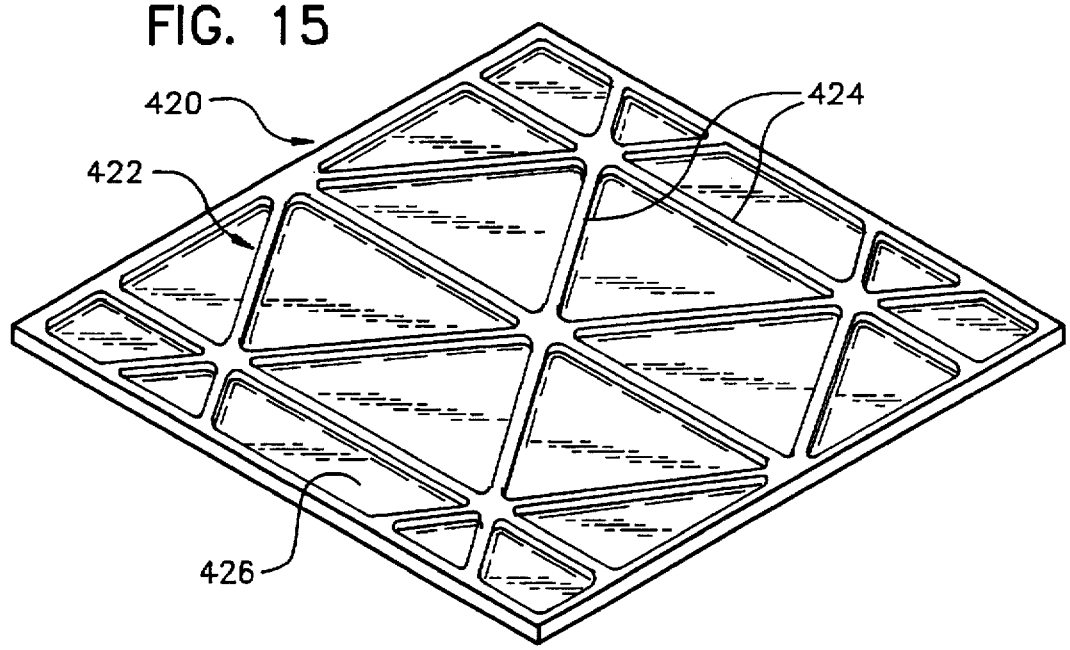

FIG. 13 is a perspective view of an enclosure wall component which embodies the principles of the present invention and separate arrays of stiffening, reinforcing, and heat dissipating ribs of two different configurations;

FIG. 14 is a section through the wall component of FIG. 13, taken essentially along line 14—14 of that figure; and FIG. 15 is a perspective view of an enclosure wall component which embodies the principles of the present invention and has an array of integral and joined, reinforcing, stiffening, and heat dissipating ribs arranged in a triangular pattern.

DETAILED DESCRIPTION OF THE INVENTION

Referring now to the drawings, FIG. 1 depicts an enclosure or container 20 constructed in accord with, and embodying, the principles of the present invention. Enclosure 20 has end walls, front and back walls, a top wall, and a bottom wall. The front wall, one end wall, and the top wall are shown in FIG. 1; and these walls are respectively identified by reference characters 22, 24, and 26. The two end walls, the top wall, and the bottom wall are all integral parts of a single enclosure component or shell 28, and the front and back walls are separate components.

All six walls of enclosure 20 (the illustrated front, right-hand end, and top walls 22, 24, and 26 and the hidden left-hand end, bottom, and rear walls) are of the same novel construction. Each has a thin skin 30 reinforced and stiffened by a rectangular array 32 of integral, external, joined, reinforcing and heat dissipating ribs 34. Ribs 34 may have an uncapped configuration. A rib of that character is depicted in FIG. 2 and identified by reference character 34-2. Alternatively, the ribs may be capped. Representative rib configurations of that character are illustrated in FIGS. 3 and 4 and identified by reference characters 34-3 and 34-4, respectively.

Typically, rib 34-2 will have fillets 36 with a radius equaling TP-TS where TS is the thickness of skin 30 and TP is the distance from the top 38 of rib 34-2 to the furtherest surface 40 of the wall in which the rib is integrated.

The rib 34-3 depicted in FIG. 3 has an hourglass cross-sectional configuration and fillets 42. Like the corresponding fillets of ribs 34-2, those identified by reference character 42 will typically have a radius of TP-TS/2 where TP and TS have the meanings assigned above and the top the integral rib 34-3 is identified by reference character 44. Rib 34-3 also has a cap 46 with concave sides 48. Cap 46 extends from the outermost ends of fillets 42 to the top 44 of rib 34-3.

Figure 4A:
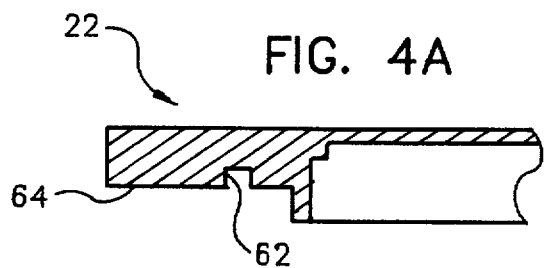
FIG. 4A is a fragmentary section through the cover of an enclosure embodying the principles of the present invention.

The capped rib 34-4 depicted in FIG. 4 has a T-shaped cross-section defined by a web 50 and a cap or flange 52 which extends from the upper ends of fillets 53 to the top 54 of the rib. In this case, the fillet radius will typically be one-half the difference between the width W of cap 52 and the width WW of web 50.

Wall structures with a thin skin and reinforcing, stiffening, and heat dissipating ribs of the character depicted in FIGS. 2 and 4 and identified by reference characters 34-2 and 34-4 can be made with one chemical milling stage. Generation of the T-like configuration shown in FIG. 3 requires two chemical milling stages.

Representative metallic materials from which enclosure 20 can be made are identified above. The metallic material can be loaded with a particulate reinforcement for increased strength if desired. Suitable reinforcement materials include: graphite, silicon carbide, silicon nitride, glass fiber, silica, and boron nitride.

4

The three components of container or enclosure 20—the back wall, the front wall 22, and the shell 28—are similar with the construction of shell 28 being typical. Consequently, only the fabrication of that component will be described in detail herein.

The first step in constructing shell 28 with a FIG. 2 or FIG. 3 rib configuration is to form a blank of the selected sheet stock into the configuration illustrated in FIG. 1. Next, the blank is cleaned and otherwise prepared for chemical milling. The blank is then masked; and the maskant is scribed and removed, exposing those areas of the blank where metal is to be removed. The shell is then immersed in a batch of etching solution to remove the unwanted metal.

At the end of the etching step, shell 28 is withdrawn from the etching solution; and the mask is stripped away. The shell is then benched (deburred) to remove sharp edges produced by the chemical milling process, and the manufacturing process is completed by final trim machining and the assembly of details (if any) to the shell. Representative operations for final detail assembly include: drilling and tapping for inserts; drilling of through holes for rivets; installation of O-rings; application of conductive EMI and RFI sealants; and the attaching of handles, latches, gauges, and shock prevention and safety equipment.

If a FIG. 3 or comparable rib configuration is selected, a second chemical milling stage follows the removal of the shell from the first stage etching solution. The shell is typically washed to remove any remaining vestiges of the etching solution and remasked. The masking material is then stripped away from those areas which will become the fillets 42 of ribs 34-3. After the maskant is thus selectively stripped away, shell 28 is again immersed in an etching solution to remove metal from the unmasked areas. At the end of this step, the shell 28 is removed from the etching solution and the mask stripped away. The second chemical milling stage is followed by steps such as those discussed above—e.g., benching, trim machining, and the assembly of details.

Typically, the rear or back wall of container 20 will be permanently integrated with shell 28. Brazing, adhesive bonding, and mechanical fasteners (bolts, rivets, pins, etc.) may be employed for this purpose. However, electron beam welding is preferred because of its speed, low input of heat to the parts being joined, and quality of the bond.

The front wall or cover 22 of container 20 will typically be assembled to shell 28 with mechanical fasteners so that it can be removed for the installation and removal of electronic or other components. Only attachment features and covers require special negation of thermal energy buildup, RFI, and EMI. In the case of the cover, these issues can typically be dealt with in the same manner described above as they are in the case of the other enclosure components.

Figure 4B:
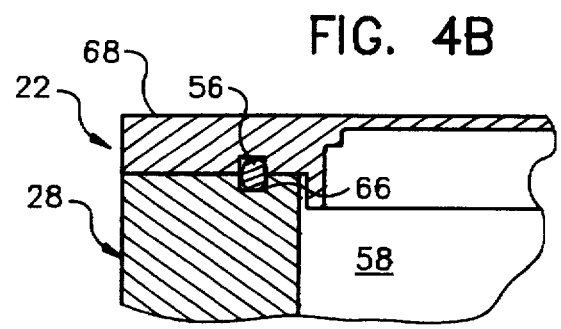
FIG. 4B is a fragmentary section showing the FIG. 4A cover attached to the shell of the cover with an O-ring between the cover and shell to isolate the interior of the cover.
Figure 6:
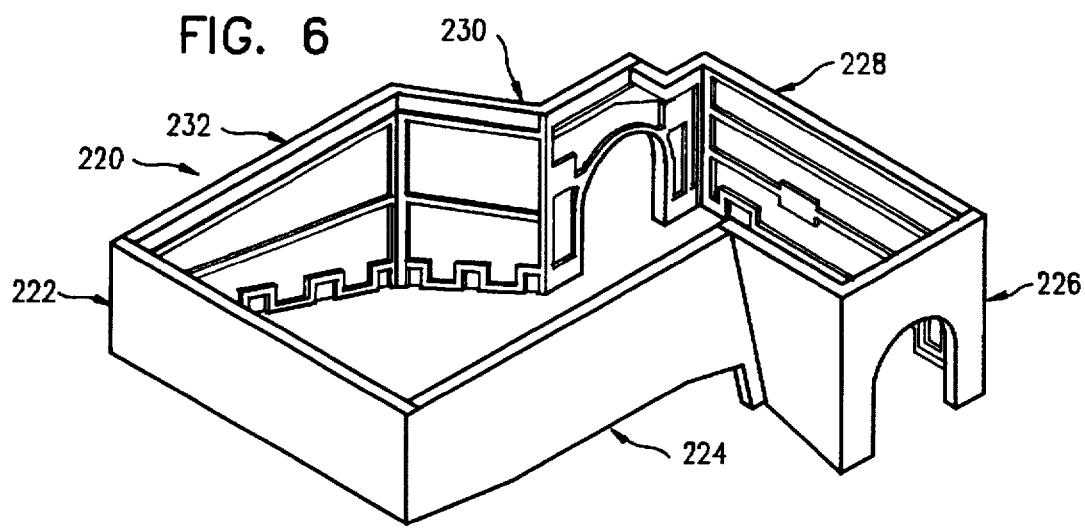
FIG. 6 is a perspective view of a complex enclosure shell with six wall components.
Figure 7:
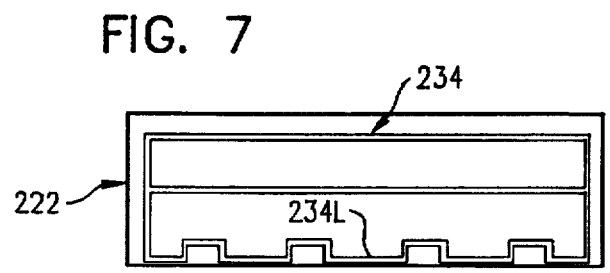

As shown in FIG. 4B, a seal 56 such as an O-ring may be installed between cover 22 and shell 28 to isolate the interior 58 of enclosure 20. This keeps foreign matter from reaching the interior of the enclosure and, if present, keeps inert or other protective gases from escaping through the joint 60 between cover 22 and shell 28. A conductive O-ring may be employed if EMI or RFI shielding are required.

O-ring 56 is seated in a groove or recess 62 which opens onto the inner side 64 of cover 22 and in a complementary recess 66 which opens onto the cover-facing edge 68 of shell 28.

Figure 5:
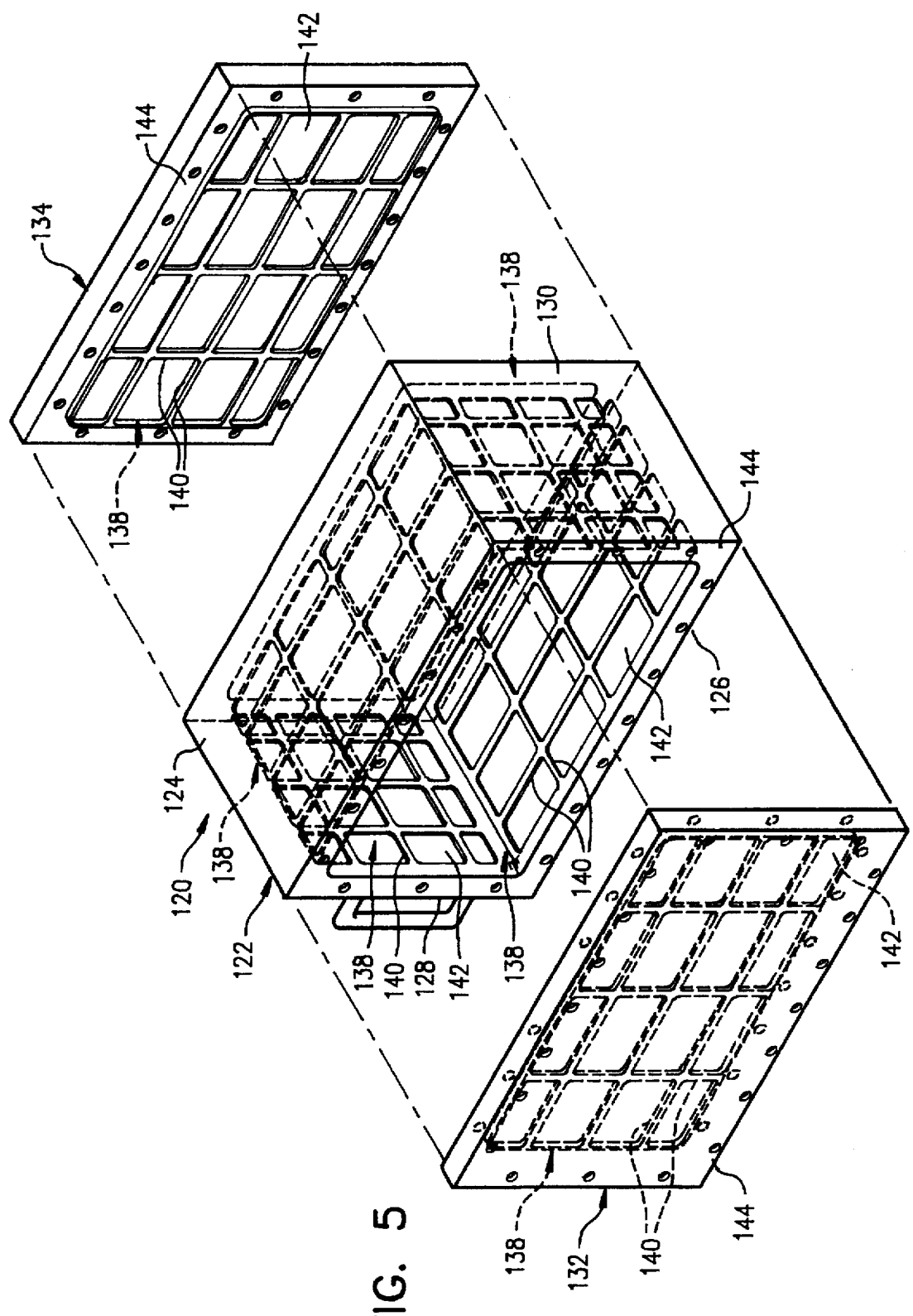
FIG. 5 is an exploded view of an enclosure embodying the principles of the present invention and differing from the enclosure depicted in FIG. 1 in that the integral ribs of its wall components are formed on the inner surfaces of those components rather than on the outer surfaces as they are in the FIG. 1 enclosure.

Referring still to the drawings, FIG. 5 depicts an enclosure or container 120 which has a shell 122 with a top wall 124, a bottom wall 126, and end walls 128 and 130. The enclosure also has removable front and back walls (or covers) 132 and 134.

In addition to having two removable covers, container 120 differs significantly from the enclosure 20 depicted in FIG. 1 in that the integral ribs employed to stiffen and strengthen shell 122 and covers 132 and 134 and to dissipate heat are internal instead of external.

The construction of each enclosure component is similar. Each component has one (or more) rectangular arrays 138 of integral, joined, stiffening, strengthening, and heat dissipating ribs 140; a thin skin 142; and a marginal portion 144 typically equal in thickness to the plate stock from which the components are fabricated. The ribs may be capped or uncapped and of any appropriate configuration; e.g., one of those shown in FIGS. 2–4.

In addition to illustrating an enclosure with an internal rib system, FIG. 5 shows that components of considerable complexity such as the illustrated enclosure shell 122 can be fabricated by the novel techniques disclosed herein; and, as suggested above, this can be easily and inexpensively done.

FIGS. 6–10 depict an even more complicated enclosure shell 220 with six wall components 222 . . . 232 all of complex configuration and all expeditiously and inexpensively fabricated by the novel manufacturing technique disclosed herein. Each of the six wall components 222 . . . 232 has an internal array of integral, joined, stiffening, reinforcing, and heat dissipating ribs. The wall components may be assembled by electron beam welding.

The rib arrays employed in components 222, 224, 228, and 232 are of the rectangular character discussed above and shown in FIGS. 1 and 5. Those arrays are identified by reference characters 234 . . . 240 with the lower rib 234L . . . 240L in each of these arrays having a stepped or picket fence configuration.

Enclosure components 226 and 230 have ribs which follow contours of these wall components. These ribs are identified by reference characters 242 . . . 248 in FIG. 9 and by reference characters 250 . . . 254 in FIG. 11.

The ribs of the six wall components 222 . . . 232 may have any appropriate cross-sectional configuration such as one of those depicted in FIGS. 2–4.

FIGS. 6–12 demonstrate even further the application of the principles of the present invention to the construction of containers and enclosures of great complexity.

It was pointed above that one can sometimes employ to advantage in container wall components embodying the principles of the present invention and employing a combination of capped and uncapped, stiffening, reinforcing, and heat dissipating ribs. A wall component of that character is depicted in FIGS. 13 and 14 and identified by reference character 320.

Wall component 320 has a rectangular array 322 of joined capped ribs 324 of the configuration shown in FIG. 14. It also has two separate, rectangular arrays 326 and 328 of secondary, uncapped, joined ribs 330. Those ribs have a configuration resembling that shown in FIG. 2.

Secondary, uncapped ribs 330 suppress vibrations in wall component 320 by raising the resonant frequencies of the skin 332 of that component to levels where resonance no longer poses a problem. Furthermore, the secondary ribs 330 significantly reduce any tendency toward elastic buckling of the skin and otherwise make the component more structurally stable. All this is accomplished, moreover, with a much smaller increase in weight than would be possible if the obvious alternative of more closely spacing capped ribs 324 were employed. The height of the secondary ribs 330 will typically range from one-tenth to one-half of the height of the capped ribs 324.

The arrays 326 and 328 of secondary ribs are formed in pockets 334 and 336 bounded by ribs 324 of array 320. The secondary ribs in each pocket extend to and join the pocket bounding primary ribs 324.

It was also pointed out above that integral ribs providing stiffening, reinforcing, and heat dissipation can be arrayed in a triangular pattern instead of the rectangular array employed in the previously disclosed embodiments of the invention. A container wall component with a triangular rib array is illustrated in FIG. 15 and identified by reference character 420.

The array of ribs is identified by reference character 422, the ribs making up the array (and joined at nodes 423) by reference character 424, and the skin of wall component 420 by reference character 426. Once again, the ribs may have any appropriate cross-section including one of those depicted in FIGS. 2–4.

The invention may be embodied in many forms without departing from the spirit or essential characteristics of the invention. The present embodiments are therefore to be considered in all respects as illustrative and not restrictive. The scope of the invention is indicated by the appended claims rather than by the foregoing description, and all changes which come within the meaning and range of equivalency of the claims are therefore intended to be embraced therein.

What is claimed is:

1. A lightweight, structurally integral housing which has walls bounding a defined space, said walls being fabricated entirely of a metallic material and each of said walls being a chemically milled component which has a skin and an array of integral reinforcing ribs on one side of said skin, said ribs being fabricated from the same material as said skin.

2. An enclosure as defined in claim 1 in which the ribs in the array are arranged in a rectangular pattern.

3. An enclosure as defined in claim 1 in which the ribs in the array are arranged in a triangular pattern.

4. An enclosure as defined in claim 1 in which the ribs are located on outer surfaces of said walls.

5. An enclosure as defined in claim 1 in which the ribs are located on inner surfaces of said walls.

6. An enclosure as defined in claim 1 in which said walls have separate arrays of primary ribs and secondary ribs, said primary ribs and said secondary ribs having different cross-sectional configurations.

7. An enclosure as defined in claim 1 or claim 6 in which said walls have ribs with an uncapped cross-sectional configuration.

8. An enclosure as defined in claim 1 in which said walls have ribs with a capped cross-sectional configuration.

9. An enclosure as defined in claim 1 in which the metallic material is titanium aluminide; a titanium alloy; or aluminum, nickel niobium, beryllium, or copper or an alloy thereof.

10. An enclosure as defined in claim 1 in which the metallic material is reinforced with particles of graphite, silicon carbide, silicon nitride, glass fiber, silica, or boron nitride.

* * * * *